(12) United States Patent
Herzinger et al.

(10) Patent No.: US 8,873,667 B2
(45) Date of Patent: Oct. 28, 2014

(54) DIGITAL MODULATION

(75) Inventors: Stefan Herzinger, Sauerlach (DE); Zdravko Boos, Munich (DE)

(73) Assignee: Intel Mobile Communications GmbH, Neubiberg (DE)

( * ) Notice: Subject to any disclaimer, the term of this patent is extended or adjusted under 35 U.S.C. 154(b) by 645 days.

(21) Appl. No.: 12/567,508

(22) Filed: Sep. 25, 2009

(65) Prior Publication Data

US 2010/0080322 A1  Apr. 1, 2010

(30) Foreign Application Priority Data

Sep. 30, 2008 (DE) .......................... 10 2008 049 666

(51) Int. Cl.
*H03C 5/00* (2006.01)
*H04L 27/04* (2006.01)
*H04L 1/00* (2006.01)
*H03C 1/54* (2006.01)

(52) U.S. Cl.
CPC . *H04L 27/04* (2013.01); *H03C 1/54* (2013.01)
USPC ............................ 375/271; 375/302; 375/295

(58) Field of Classification Search
USPC ......... 375/219, 220, 221, 222, 271, 279, 280, 375/281, 282, 283, 295, 302
See application file for complete search history.

(56) References Cited

U.S. PATENT DOCUMENTS

| | | | |
|---|---|---|---|
| 5,142,236 A * | 8/1992 | Maloberti et al. | ............. 327/337 |
| 5,450,044 A | 9/1995 | Hulick | |
| 5,805,321 A | 9/1998 | Ooi et al. | |
| 6,236,344 B1 | 5/2001 | Benz et al. | |
| 6,393,070 B1 | 5/2002 | Reber | |
| 7,023,292 B2 | 4/2006 | Pehlke et al. | |
| 2004/0184559 A1 * | 9/2004 | Ballantyne | ..................... 375/300 |

FOREIGN PATENT DOCUMENTS

WO  PCT/US99/26913 A2  7/2000

* cited by examiner

*Primary Examiner* — Sam K Ahn
*Assistant Examiner* — Linda Wong
(74) *Attorney, Agent, or Firm* — Eschweiler & Associates, LLC

(57) ABSTRACT

The present application relates to embodiments of methods and a device for digital modulation. In a first embodiment of the method, the following steps are executed:
determining a polarity of the signal,
providing an inverted carrier signal,
providing an inverted signal by an inversion of the polarity of at least one portion of the signal,
mixing the signal with the carrier signal when the signal has the first polarity, and
mixing the inverted signal with the inverted carrier signal when the signal has the second polarity.

11 Claims, 4 Drawing Sheets

DIGITAL MODULATION

CROSS-REFERENCE TO RELATED APPLICATIONS

This application claims priority from German Patent Application No. 102008049666.9, which was filed on Sep. 30, 2008, and is incorporated herein in its entirety by reference.

BACKGROUND OF THE INVENTION

The present invention relates to a method and a device for a digital modulation.

A modulator is used for the modulation of a useful signal onto a carrier signal. A modulator is frequently used in transmission systems, like, for example, in wire-bonded or wireless communication systems.

In different communication systems, here different types of modulation are used for the modulation of information included in the useful signal onto the carrier signal. Examples for this are modulation types which use a phase modulation and/or an amplitude modulation.

In particular in a mobile communication system, like, e.g., a mobile radio system having a time-limited energy supply, it is here desirable for the modulator to comprise a high power efficiency. Thus, a low energy consumption and thus a longer operation time of a corresponding terminal device may be achieved.

In particular in the field of mobile radio, a parallel propagation of different communication standards exists, like, e.g., of GSM, EDGE, UMTS, HSUPA, WLAN, Wimax, DECT, Bluetooth, etc. The same use different modulation types. In some standards the same are present in a combined way to achieve higher bandwidths. It is accordingly possible to provide modulators which may execute a modulation for different communication standards. For example, high-frequency transmission devices exist which may execute both a GMSK modulation with a constant envelope of the output signal for a GSM mobile radio system and an 8-PSK modulation with a non-constant envelope for an EDGE mobile radio system.

Current solutions utilize a Cartesian modulator architecture or a polar modulator architecture. They have the disadvantage, however, that they comprise a high portion of analog circuit blocks. These disadvantages, compared to digital circuit blocks, are, for example, a greater error and/or distortions by analog filter adaptations in the representation of constellation points of the modulation scheme used. Such deviations are, for example, indicated with the so-called error vector magnitude (EVM). By a direct current portion (DC offset) in signal processing, an increased loss of the carrier signal results (carrier leakage). All in all, a higher power consumption thus results which is not wanted particularly in mobile terminal devices.

When using analog circuit blocks, compared to digital circuit blocks a greater chip area is needed if the transmission device is arranged in an integrated member. In this connection, additional problems result with the scaling of circuit structures when using new, minimized semiconductor technologies.

It is thus desirable for a transmission device to comprise a highest possible portion of digital circuit blocks or a high portion of switched logical blocks, respectively.

The present invention is based on the problem of providing a method for a power-efficient modulation and/or a power-efficient modulation device.

This object is achieved by the method having the features of patent claim 1 and/or by the modulation device having the features of patent claim 5.

The method for modulating a signal alternating between a first polarity and a second polarity onto a carrier signal comprises the following steps:
providing an inverted carrier signal,
determining a polarity of the signal,
mixing the signal with the carrier signal when the signal comprises the first polarity, and
mixing the signal with the inverted carrier signal when the signal comprises the second polarity.

The modulation device for modulating a signal alternating between a first polarity and a second polarity onto a carrier signal comprises an inverter for providing an inverted carrier signal. Further, it comprises a means for determining a polarity of the signal. Further, it comprises a mixer cell which is coupled to the inverter and to the means and which is implemented such that it mixes the signal with the carrier signal when the signal comprises the first polarity and that it mixes the signal with the inverted carrier signal when the signal comprises the second polarity.

Different advantageous implementations and embodiments of the invention result from the dependent claims.

BRIEF DESCRIPTION OF THE DRAWINGS

In the following, the invention is explained in more detail with reference to the accompanying drawings, in which.

DETAILED DESCRIPTION OF THE INVENTION

All embodiments have in common that the illustrated modulation devices each modulate one signal onto a carrier signal.

The signal is a useful signal containing information. It is usually present as a digital signal in the baseband and is modulated onto the carrier signal by the modulation device. The carrier signal is a signal centered around a carrier frequency. The carrier frequency usually corresponds to a center frequency of a transmission band of a communication system. Usually, the carrier signal is generated by a frequency synthesizer, like, e.g. a controlled oscillator, a phase-locked loop or a ring oscillator.

Figure 1:
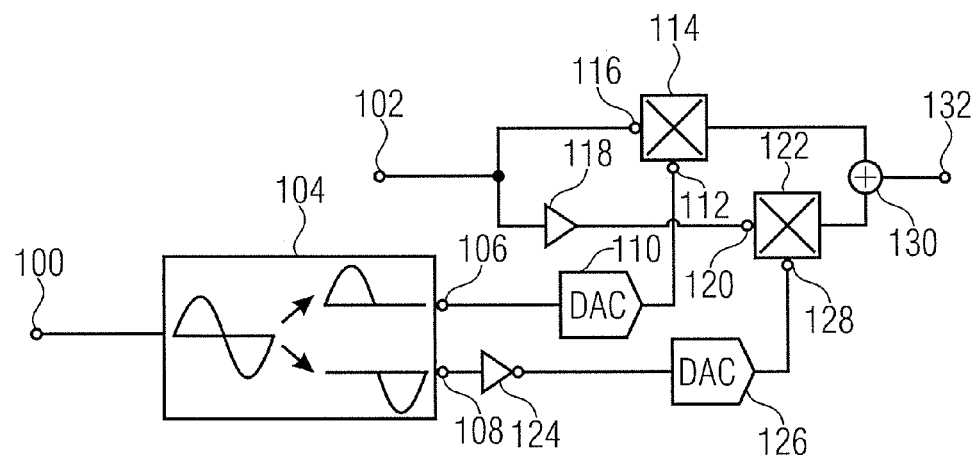
FIG. 1 shows a first embodiment of a modulation device.

FIG. 1 shows a first embodiment of a modulation device. The modulation device comprises a first input 100 for receiving a signal and a second input 102 for receiving a carrier signal. The first input 100 is connected to a signal divider 104. The signal divider 104 divides the signal according to a polarity of the signal into a first signal component and a second signal component. The first signal component is provided at a first signal divider output 106. The second signal component is provided at a second signal divider output 108.

Here, the first signal component corresponds to the portion of the signal comprising the first polarity, for example the case of a positive signal level. The second signal component corresponds to the portion of the signal comprising the second polarity, for example the case of a negative signal level. Here, the signal divider 104 represents a means dividing a signal alternating between two polarities into two signal components, respectively corresponding to the portion of one of the polarities. The original signal may be reproduced by a time-accurate overlaying of the signal components.

In the illustrated embodiment, the signal is a digital signal. The signal divider 104 executes a digital signal processing and provides the first signal component and the second signal component in a digital form.

The first signal divider output 106 is connected to a first input 112 of a first mixer 114 via a first digital/analog converter 110. The first digital/analog converter 110 converts the first signal component into a first analog signal component. A second input 116 of the first mixer 114 is connected to the second input 102. In the first mixer 114, the first analog signal component is mixed onto the carrier signal, and thus a first modulation component is provided.

The input 102 is further connected to the first input 120 of a second mixer 122 via a first inverter 118. The second signal divider output 108 is connected to a second digital/analog converter 126 via a digital inverter 124. The second digital/analog converter 126 thus provides a second analog signal component determined from the second signal component by an inversion of the polarity and a subsequent digital/analog conversion. It is obvious that the steps may be executed in any order to achieve the same result. The second digital/analog converter 126 is coupled to a second input 128 of the second mixer 122 to provide the second analog signal component to the same. In the second mixer 122 the second analog signal component is mixed onto the inverted carrier signal, and thus a second modulation component is provided. As the determination of the second analog signal component includes an inversion of the second signal component, the signal processing of the second mixer 122 corresponds to a modulation of the second signal component onto the carrier signal.

The outputs of the first mixer 114 and the second mixer 122 are supplied to the inputs of an adder 130 and overlaid there. In a simple realization of the adder 130 a node is provided at which the outputs of the mixers are brought together. An output of the adder 130 is connected to a signal output 132 of the modulation device.

The modulation device illustrated in FIG. 1 executes a modulation of the signal onto the carrier signal by dividing the signal into two signal components. The first signal component corresponds to the portion of the signal comprising a first (e.g. positive) polarity. The second signal component corresponds to the portion of the signal comprising a second (e.g. negative) polarity. The modulation is subsequently individually executed for each of the signal components. Subsequently, the separately provided modulation components are combined. This technology thus uses a separate signal processing according to the polarity of the signal. In particular, it is thus possible to apply a certain type of mixer in the modulation device. A signal component is supplied both to the first mixer 114 and also to the second mixer 122 at one input, wherein the signal component only comprises one polarity. Signal portions of the other polarity are processed in the other signal path. This allows the use of a so-called "unipolar mixer cell", and/or a single-sign mixer cell for the first mixer 114 and the second mixer 122. Such a mixer cell is implemented to process a sign of the modulating signal in contrast to conventional mixer cells which may process both signs of the signal to be modulated. By this, in particular a high efficiency may be achieved when mixing the signal component with the carrier signal.

Figure 2:
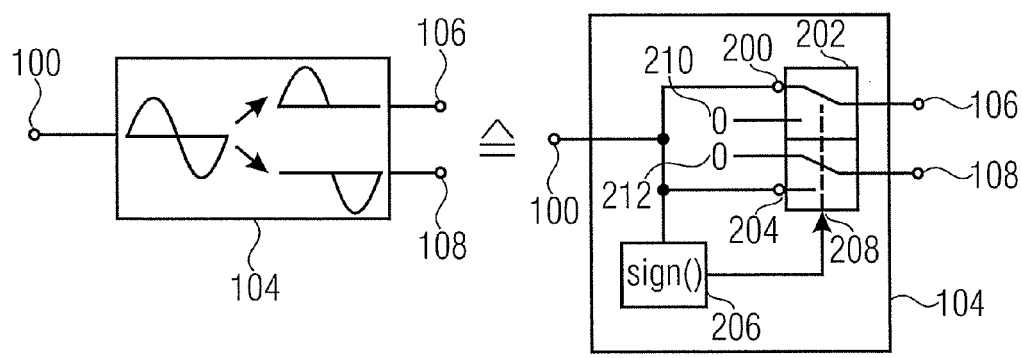
FIG. 2 shows an exemplary signal divider for application in the first embodiment of FIG. 1.

FIG. 2 shows an exemplary signal divider for an application in the first embodiment of FIG. 1. On the left side, FIG. 2 shows the symbol of a signal divider 104 with an input 100 for receiving the signal. A first signal component determined from the signal is provided at a first signal divider output 106. A second signal component determined from the signal is provided at a second signal divider output 108. On the right side, a schematical illustration of a block diagram of the setup of the signal divider is represented.

The input 100 is connected to a first multiplexer input 200 of a multiplexer arrangement 202. It is further connected to a second multiplexer input 202 of the multiplexer arrangement 202. Finally, the input 100 is connected to a means 206 for determining the polarity of the signal. The means 206 for determining the polarity of the signal determines the polarity of the signal. For the case of a digital input signal, it determines the sign of the signal value, which is usually separately indicated by one bit. In this case, the determination of a value of one bit from the digital word of the signal is sufficient. The means 206 for determining the polarity of the signal is connected to a control input 208 of the multiplexer arrangement 202 and switches the multiplexer arrangement 202 according to the determined polarity of the signal.

The multiplexer arrangement 202 further comprises a third multiplexer input 210 and a fourth multiplexer input 212. At the third multiplexer input 210 and the fourth multiplexer input 212 a constant input signal is applied to which a zero value of the signal corresponds, i.e. a value of the signal whose polarity is undetermined. This may, for example, be a zero level or a data word corresponding to zero. The constant input signal may, for example, be stored in a register and be readable from there. It is further possible that the constant input signal is provided by a mass and/or reference voltage terminal.

According to the polarity of the signal determined by the means 206, the multiplexer arrangement 202 connects the first signal divider output 106 to the input 100 or the constant input signal. At the same time, the multiplexer arrangement 202 connects the second signal divider output 108 to the constant input signal or to the input 100. Here, either the signal is provided at the first signal divider output 106 and the constant input signal at the second signal divider output 108 (first state) or the constant input signal is provided at the first signal divider output 106 and the signal at the second signal divider output 108 (second state). In one possible implementation, the first state is assumed for the case of a positive polarity, i.e. a positive sign of the signal, and the second state for the case of a negative polarity, i.e. a negative sign of the signal. It is thus achieved that, at the first signal divider output 106, the first signal component is provided with the signal portion of a positive polarity, while at the second signal divider output 108 the second signal component is provided with the signal portion of a negative polarity.

For the case that the signal takes on an undetermined polarity, for example the polarity determined last may further be assumed, as the multiplexer arrangement 202 provides correct output values in every state at the first signal divider output 106 and the second signal divider output 108.

Figure 3:
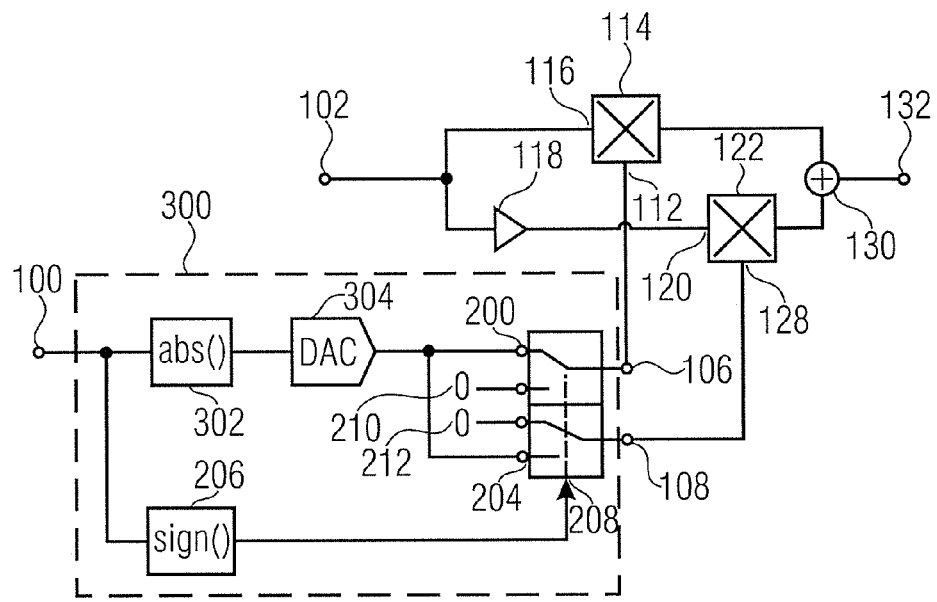
FIG. 3 shows a second embodiment of a modulation device.

FIG. 3 shows a second embodiment of a modulation device. The modulation device comprises a first input 100 for receiving a signal and a second input 102 for receiving a carrier signal. The first input 100 is connected to a signal divider 300 (illustrated in dashed lines).

The signal divider 300 divides the signal according to a polarity of the signal into a first signal component and a second signal component. The first signal component is provided at a first signal divider output 106. The second signal components is provided at a second signal divider output 108.

Here, the first signal component corresponds to the portion of the signal comprising the first polarity, e.g. the case of a positive signal level. The second signal component corresponds to the portion of the signal comprising the second polarity, e.g. the case of a negative signal level. Here, the signal divider 300 represents a means dividing a signal alternating between two polarities into two signal components which respectively correspond to the portion of one of the polarities.

In the illustrated embodiment, the signal is a digital signal. The signal divider 300 provides the first signal component and the second signal component in an analog form, however. In this respect, the signal divider 300 comprises a first means 206 for determining the polarity of the signal which is connected to the input 100 so that the signal is supplied to the same. The first means 206 determines the polarity of the signal. For the case of a digital input signal it determines the sign of the signal value, which is conventionally separately indicated by one bit. In this case, the determination of a value of one bit from the digital word of the signal is sufficient.

The input 100 is further connected to a second means 302 for forming an absolute value of the signal and/or for providing a unipolar signal from the signal. The signal is supplied to the second means 302 for forming an absolute value. In the second means 302 an output signal is provided representing the absolute value of the signal. For the case of a digital input signal, it sets the sign of the signal value to a positive value. With regard to FIG. 4, a possible implementation of the second means 302 is illustrated. Apart from that, a plurality of embodiments are possible, for example in which the sign is truncated or set to a certain value in another form.

The output signal is supplied to a multiplexer arrangement 202 via a digital/analog converter 304. On the output side, the digital/analog converter 304 is connected to a first multiplexer input 200 of a multiplexer arrangement 202. It is further connected to a second multiplexer input 202 of the multiplexer arrangement 202.

The means 206 for determining the polarity of the signal is connected to a control input 208 of the multiplexer arrangement 202 and switches the multiplexer arrangement 202 according to the determined polarity of the signal.

The multiplexer arrangement 202 further comprises a third multiplexer input 210 and a fourth multiplexer input 212. At the third multiplexer input 210 and the fourth multiplexer input 212 a constant input signal is applied which corresponds to a zero value of the signal, i.e. a value of the signal whose polarity is undetermined. This may, for example, be a zero level or a data word corresponding to a zero. The constant input signal may, for example, be stored in a register and be readable from there. It is further possible that the constant input signal is provided by a mass and/or reference voltage terminal.

According to the polarity of the signal determined by the first means 206, the multiplexer arrangement 202 connects the first signal divider output 106 to the digital/analog converter 304 or the constant input signal. Simultaneously, the multiplexer arrangement 202 connects the second signal divider output 108 to the constant input signal or to the digital/analog converter 304.

Here, either the signal is provided at the first signal divider output 106 and the constant input signal at the second signal divider output 108 (first state) or the constant input signal is provided at the first signal divider output (106) and the signal at the second signal divider output 108 (second state). In one possible implementation, the first state is assumed for the case of a positive polarity, i.e. a positive sign of the signal, and the second state for the case of a negative polarity, i.e. a negative sign of the signal. It is thus achieved that at the first signal divider output 106 the first signal component with the signal portion of a positive polarity is provided, while at the second signal divider output 108 the second signal component with the signal portion of a negative polarity is provided.

For the case that the signal assumes an undetermined polarity, for example the polarity determined last may further be assumed, as the multiplexer arrangement 202 at the first signal divider output 106 and the second signal divider output 108 provides correct output values in every state.

The first signal divider output 106 is connected to a first input 112 of a first mixer 114. A second input 116 of the first mixer 114 is connected to the second input 102. In the first mixer 114 the first signal component is mixed to the carrier signal and thus a first modulation component is provided.

The input 102 is further connected to the first input 120 of a second mixer 122 via a first inverter 118. The second signal divider output 108 is coupled to a second input 128 of the second mixer 122 to supply the second signal component to the same. In the second mixer 122 the second signal component is mixed to the inverted carrier signal and thus a second modulation component is provided. Because the determination of the second signal component, by forming an absolute value, includes an inversion of the second signal component, the signal processing of the second mixer 122 corresponds to a modulation of the second signal component onto the carrier signal.

The outputs of the first mixer 114 and the second mixer 122 are supplied to the inputs of an adder 130 and are overlaid there. In a simple realization of the adder 130 a node is provided at which the outputs of the mixers are brought together. An output of the adder 130 is connected to a signal output 132 of the modulation device.

Compared to the embodiment illustrated in FIG. 1, the embodiment of FIG. 3 comprises less components as a digital/analog converter may be omitted. It is here necessitated, however, to provide an absolute value of the signal. As digital/analog converter architectures generally comprise a power loss, the use of a digital/analog converter 304 has an advantage with regard to energy efficiency.

Figure 4:
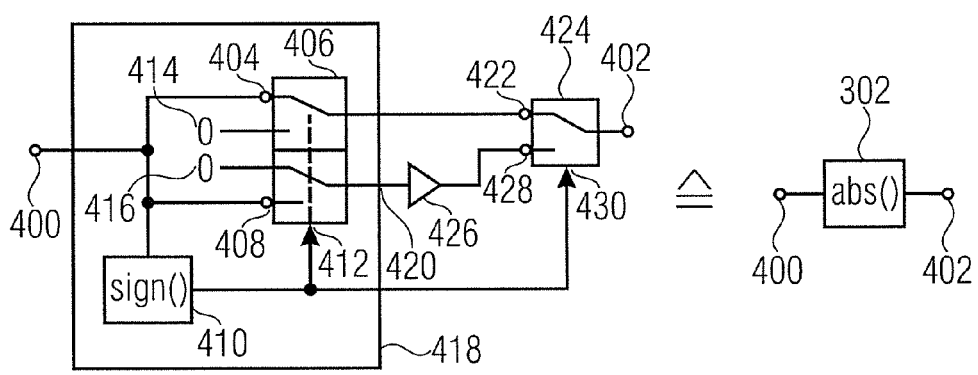
FIG. 4 shows an exemplary means for providing a unipolar signal for an application in the first embodiment of FIG. 3.

FIG. 4 shows an exemplary means for providing a unipolar signal for being applied in the first embodiment of FIG. 3. On the right-hand side, FIG. 4 shows the symbol of means for providing a unipolar signal with an input 400 for receiving the signal. A unipolar output signal determined from the signal is provided at an output 402. On the left-hand side, a schematical illustration of a block diagram of the setup of the means is represented.

The input 400 is connected to a first multiplexer input 404 of a multiplexer arrangement 406. It is further connected to a second multiplexer input 408 of the multiplexer arrangement 406. Finally, the input 400 is connected to a means 410 for determining the polarity of the signal. The means 410 determines the polarity of the signal. For the case of a digital input signal, it determines the sign of the signal value which is usually indicated separately by one bit. In this case, the determination of one value of one bit from the digital word of the signal is sufficient. The means 410 is connected to a control input 412 of the multiplexer arrangement 406 and switches the multiplexer arrangement 406 according to the determined polarity of the signal.

The multiplexer arrangement 406 further comprises a third multiplexer input 414 and a fourth multiplexer input 416. At the third multiplexer input 414 and the fourth multiplexer input 416 a constant input signal is applied with corresponds to a zero value of the signal, i.e. a value of the signal whose polarity is undetermined. This may, for example, be a zero level or a data word which corresponds to a zero. The constant input signal may, for example, be stored in a register and be readable from there. It is also possible that the constant input signal is provided by a mass and/or reference voltage terminal.

According to the polarity of the signal determined by the means 410, the multiplexer arrangement 406 connects a first multiplexer output 418 to the input 400 or the constant input signal. Simultaneously, the multiplexer arrangement 202 connects a second multiplexer output 420 to the constant input signal or to the input 400. Here, either the signal is provided at the first multiplexer output 418 and the constant input signal at the second multiplexer output 420 (first state) or the constant input signal is provided at the first multiplexer output 418 and the signal at the second multiplexer output 420 (second state). In one possible implementation, the first state is assumed for the case of a positive polarity, i.e. a positive sign of the signal, and the second state is assumed for the case of a negative polarity, i.e. a negative sign of the signal. It is thus achieved that, at the first multiplexer output 418, the first signal component is provided with the signal portion of a positive polarity, while, at the second multiplexer output 420, the second signal component is provided with the signal portion of a negative polarity.

For the case that the signal takes on an undetermined polarity, for example the polarity determined last may further be assumed, as the multiplexer arrangement 202 at the first multiplexer output 418 and the second multiplexer output 420 provides correct output values in each state.

The first multiplexer output 418 is connected to a first input 422 of a multiplexer 424 and the second multiplexer output 420 is connected to a second input 428 of the multiplexer 424 via an inverter 424. A control input 430 is connected to the means 410. The multiplexer 424 is controlled according to the polarity of the signal.

Thus, the signal at the output 402 is provided with a positive polarity, as such portions of the signal comprising a negative polarity are passed on to the output 402, inverted by the inverter 426.

The multiplexer 424 may be implemented as a simple switch.

Figure 5:
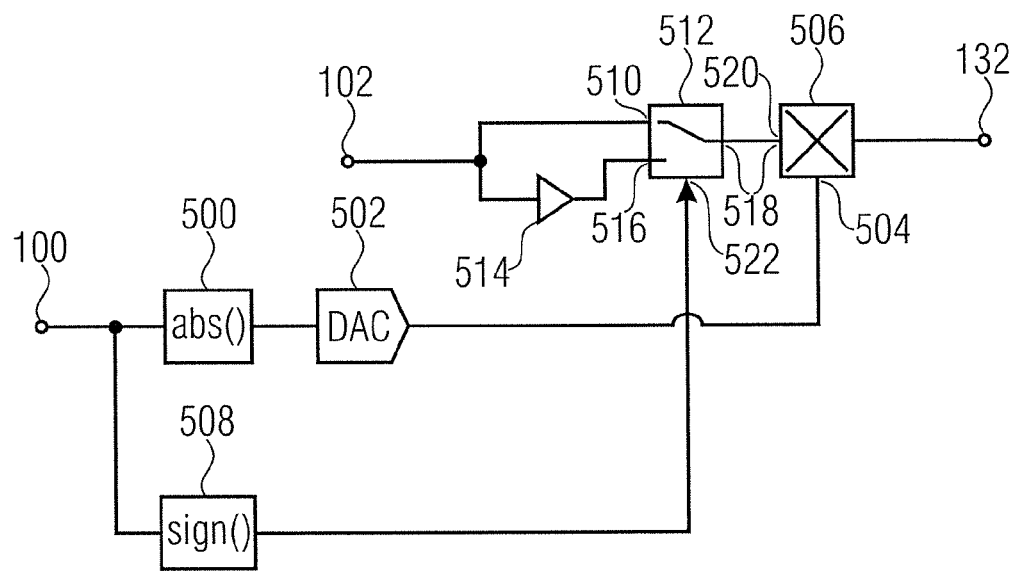
FIG. 5 shows a third embodiment of the modulation device.

FIG. 5 shows a third embodiment of the modulation device. The modulation device comprises a first input 100 for receiving a signal and a second input 102 for receiving a carrier signal. The modulated signal is provided at an output 132.

The first input 100 is provided with a means 500 for providing a unipolar signal which may, for example, be implemented by the means of FIG. 4. The means 500 generates a unipolar signal from the signal, in which portions with a negative polarity are inverted. It is connected to a first mixer input 504 of a mixer 506 via a digital/analog converter 502. The mixer 506 may be implemented analog to the embodiments of FIG. 1 and FIG. 3 as a single-sign mixer.

The first input 100 is further connected to a means 508 for determining the polarity of the signal. The means 508 for determining the polarity of the signal determines the polarity of the signal. For the case of a digital input signal it determines the sign of the signal value which is usually separately indicated by one bit. In this case, the determination of a value of one bit from the digital word of the signal is sufficient.

The second input 102 is connected to a first multiplexer input 510 of a multiplexer 512. It is connected to a second multiplexer input 516 of the multiplexer 512 via an inverter 514. A multiplexer output 518 is connected to a second mixer input 520 of the mixer 506. A control input 522 of the multiplexer 512 is connected to the means 508.

A mixer output 524 is connected to the output 132.

The illustrated modulator uses the inventive principle by representing the signal to be modulated as an absolute signal. This means that a unipolar signal is made from the signal by inverting the signal portions which comprise a negative polarity. The unipolar signal is selectively applied onto the carrier signal or the inverted carrier signal with the help of the multiplexer 512. Here, the unipolar signal is applied to the carrier signal when the signal comprises a positive polarity, and it is applied to the inverted carrier signal when the signal comprises a negative polarity. At the output, thus a phase- and sign-corrected, modulated signal is provided.

In contrast to the embodiments of FIG. 1 and FIG. 2, the embodiment of FIG. 5 does not divide the signal into two portions, whereby errors regarding run-time differences are reduced. Additionally, a low-effort and efficient circuit results.

Figure 6:
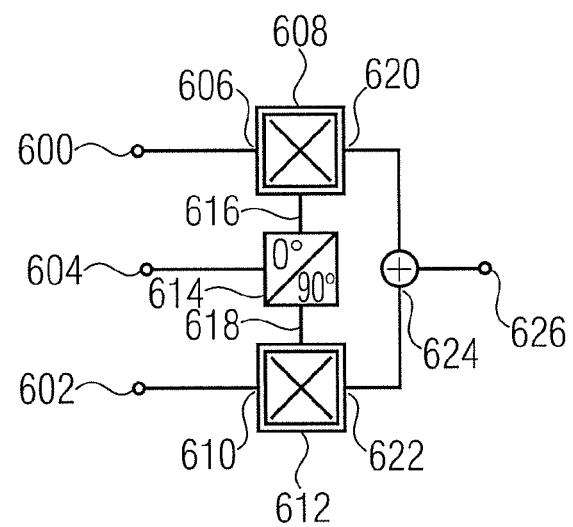
FIG. 6 shows a Cartesian modulator with the inventive modulation device.

FIG. 6 shows a Cartesian modulator with the inventive modulation device. The modulator comprises a first input 600 for receiving an in-phase component of a useful signal, a second input 602 for receiving a quadrature component of a useful signal and a carrier signal input 604.

The first input 600 is connected to a signal input 606 of a first modulation device 608. The first modulation device 608 is an inventive modulation means and may, for example, be implemented by one of the implementations of FIG. 1, FIG. 3 or FIG. 5.

The second input 602 is connected to a signal input 610 of a second modulation device 612. Also the second modulation device 608 is an inventive modulation means and may, for example, be implemented by one of the implementations of FIG. 1, FIG. 3 or FIG. 5.

The carrier signal input 604 is connected to a carrier signal input 616 of the first modulation device 608 and a carrier signal input 618 of the second modulation device 612 via a phase shifter 614. The phase shifter 614 provides the carrier signal in a phase-corrected manner at the carrier signal input 616 of the first modulation device 608 and shifted by a phase of 90° at the carrier signal input 618 of the second modulation device 612.

An output 620 of the first modulation device 608 and an output 622 of the second modulation device 612 are connected to a modulator output 626 via an adder 624.

The illustrated modulator represents a conventional Cartesian modulator in which the mixers are, however, replaced by an inventive modulation device.

Figure 7:
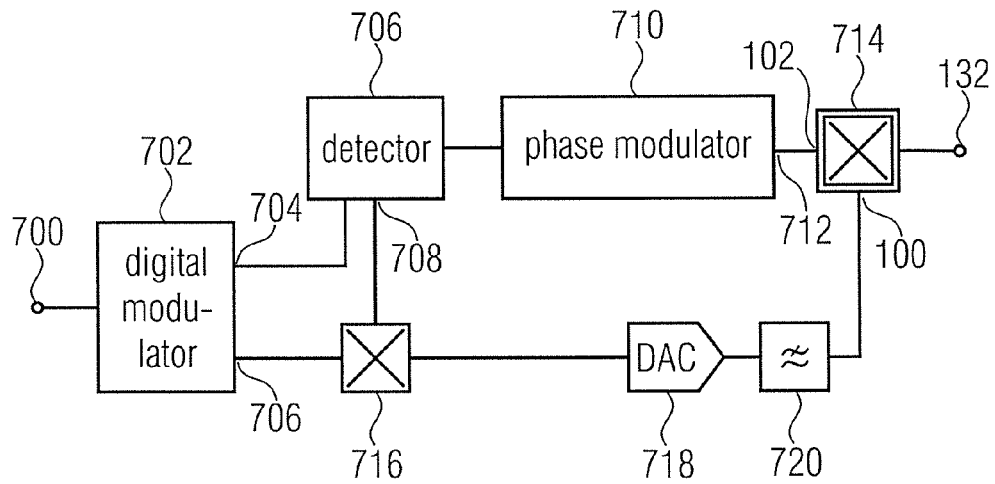
FIG. 7 shows a polar modulator with the inventive modulation device.

FIG. 7 shows a polar modulator comprising the inventive modulation device. The polar modulator comprises an input 700 for receiving a useful signal. The useful signal is present in a digital form and is, for example, provided by a base band-processing unit and/or a microprocessor or another digital signal processing unit. The input 700 is connected to a digital modulator 702. The digital modulator 702 executes a digital modulation and possibly a pulse shaping of the useful signal. The modulation here includes both a phase modulation and also an amplitude modulation of the useful signal. The digital modulator 702 provides a phase signal at a first modulator output 704 which contains phase information of the modulated useful signal. At the second modulator input 706, amplitude information of the modulated useful signal is provided.

The first modulator output 704 is connected to a detector 706, which provides, for the case of a phase leap of about 180° at a detector output 708 a sign signal with the value "−1". In all other cases, the detector provides a sign signal with the value "+1" at the detector output 708.

The detector 706 further supplies the phase signal to a phase modulator 710. The phase modulator 710 provides a carrier signal modulated depending on the phase signal at a phase modulator output 712, wherein the signal is supplied to a second input 102 of a modulation device 714. The modulation device 714 is an inventive modulation means and may, for example, be implemented by one of the implementations of FIG. 1, FIG. 3 or FIG. 5.

The second modulator output 706 is connected, via a multiplier 716, to a digital/analog converter 718 which is in turn connected to a first input 100 of the modulation device 714 via a low pass filter 720.

The multiplier 716 is connected to the detector output 708 and receives the sign signal to multiply the same with the amplitude signal. The thus corrected amplitude signal is converted into an analog amplitude signal in the digital/analog converter 718. After a filtering in the low pass filter 720, the thus processed amplitude signal is modulated in the modulation device to the phase-modulated carrier signal and provided at an output 132 of the polar modulator.

The illustrated embodiment of the polar modulator is especially suitable for a transmission system in which phase leaps close to 180° exist. For example, this is the case in a UMTS system. As such phase leaps often represent difficulties in phase modulation, it is advantageous to consider the phase leap with the amplitude signal and have the phase modulator 710 accordingly not execute phase leaps of approx. 180°.

Figure 8:
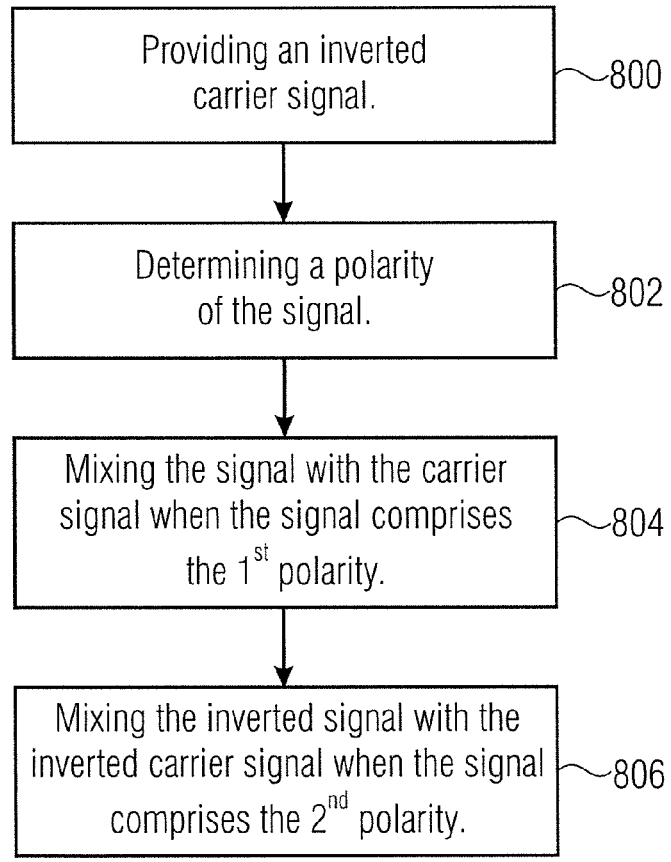
FIG. 8 shows an embodiment of a method for modulating a signal alternating between a first polarity and a second polarity onto a carrier signal.

FIG. 8 shows an embodiment of a method for modulating a signal alternating between a first polarity and a second polarity onto a carrier signal.

In a first step 800 an inverted carrier signal is provided.

In a second step 802 a polarity of the signal is determined.

In a third step 804 the signal is mixed with the carrier signal when the signal comprises the first polarity, and in a fourth step 806 the signal is mixed with the inverted carrier signal when the signal comprises the second polarity.

The sequence of the steps is here randomly interchangeable as far as steps 800 and 802 are executed before steps 804 and 806.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. A method for modulating a signal alternating between a first polarity and a second polarity onto a carrier signal, comprising:
   determining a polarity of the signal,
   providing an inverted carrier signal,
   providing an inverted signal by an inversion of the polarity of at least one portion of the signal,
   mixing the signal with the carrier signal only when the signal comprises the first polarity, and
   mixing the inverted signal with the inverted carrier signal only when the signal comprises the second polarity.

2. The method according to claim 1, comprising:
   providing a first partial signal corresponding to the signal portion of the signal comprising the first polarity, and
   providing a second partial signal corresponding to the inverted signal portion of the signal comprising the second polarity.

3. The method according to claim 2, comprising:
   mixing the first partial signal with the carrier signal, and
   mixing the second partial signal with the inverted carrier signal.

4. The method according to claim 1, comprising:
   providing a unipolar signal from the signal,
   mixing the unipolar signal with the carrier signal when the signal comprises the first polarity, and
   mixing the unipolar signal with the inverted carrier signal when the signal comprises the second polarity.

5. A modulation device for modulating a signal alternating between a first polarity and a second polarity onto a carrier signal, comprising:
   an inverter for providing an inverted carrier signal,
   a means for determining a polarity of the signal and
   a mixer coupled to the inverter and the means for determining by mixing the signal with the carrier signal only when the signal comprises the first polarity and mixing the signal with the inverted carrier signal only when the signal comprises the second polarity.

6. The modulation device according to claim 5, wherein the mixer comprises a mixer cell.

7. The modulation device according to claim 5, wherein the mixer comprises a switching element controlled by the means.

8. The modulation device according to claim 5, wherein the mixer comprises a signal divider providing a first partial signal and a second partial signal, wherein the first partial signal corresponds to the signal portion of the signal with the first polarity and the second partial signal corresponds to the inverted signal portion of the signal with the second polarity.

9. The modulation device according to claim 5, wherein the mixer comprises a means for providing a unipolar signal from the signal.

10. The modulation device according to claim 5, which is arranged in a Cartesian modulator.

11. The modulation device according to claim 5, which is arranged in a polar modulator.

\* \* \* \* \*